(12) United States Patent
Schuler et al.

(10) Patent No.: US 8,159,020 B2
(45) Date of Patent: Apr. 17, 2012

(54) NON-VOLATILE TWO TRANSISTOR SEMICONDUCTOR MEMORY CELL AND METHOD FOR PRODUCING THE SAME

(75) Inventors: Franz Schuler, Dresden (DE); Georg Tempel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/561,905

(22) Filed: Sep. 17, 2009

(65) Prior Publication Data
US 2010/0006925 A1 Jan. 14, 2010

Related U.S. Application Data

(60) Continuation of application No. 11/331,473, filed on Jan. 13, 2006, now Pat. No. 7,709,884, which is a division of application No. 10/501,430, filed as application No. PCT/DE02/04521 on Dec. 10, 2002, now Pat. No. 7,018,898.

(30) Foreign Application Priority Data

Jan. 15, 2002 (DE) ................................. 102 01 303

(51) Int. Cl.
*H01L 29/423* (2006.01)
*H01L 29/788* (2006.01)
*H01L 21/8247* (2006.01)

(52) U.S. Cl. ........ 257/326; 257/316; 257/407; 257/412; 257/E21.69; 257/E29.129; 257/E29.3; 438/258; 438/266; 438/594; 365/104; 365/184; 365/185.01

(58) Field of Classification Search .................. None
See application file for complete search history.

(56) References Cited

U.S. PATENT DOCUMENTS

| 4,420,871 | A | * | 12/1983 | Scheibe ........................ 438/258 |
| 4,816,883 | A | | 3/1989 | Baldi |
| 5,081,054 | A | | 1/1992 | Wu et al. |
| 5,172,200 | A | * | 12/1992 | Muragishi et al. ............ 257/315 |
| 5,321,287 | A | | 6/1994 | Uemura et al. |
| 5,589,699 | A | * | 12/1996 | Araki ............................ 257/316 |
| 5,723,888 | A | * | 3/1998 | Yu ................................. 257/319 |

(Continued)

FOREIGN PATENT DOCUMENTS

EP 1 102 319 A1 5/2001

(Continued)

OTHER PUBLICATIONS

Translation of Notice of Reasons for Refusal, Issued in counterpart Japanese patent application No. 2003-5651002, Oct. 9, 2007, 5 pages.

(Continued)

*Primary Examiner* — Hoang-Quan Ho

(57) ABSTRACT

The invention relates to a nonvolatile two-transistor semiconductor memory cell and an associated fabrication method, source and drain regions (2) for a selection transistor (AT) and a memory transistor (ST) being formed in a substrate (1). The memory transistor (ST) has a first insulation layer (3), a charge storage layer (4), a second insulation layer (5) and a memory transistor control layer (6), while the selection transistor (AT) has a first insulation layer (3 ') and a selection transistor control layer (4\*). By using different materials for the charge storage layer (4) and the selection transistor control layer (4\*), it is possible to significantly improve the charge retention properties of the memory cell by adapting the substrate doping with electrical properties remaining the same.

4 Claims, 4 Drawing Sheets

U.S. PATENT DOCUMENTS

| | | | |
|---|---|---|---|
| 5,801,414 A | 9/1998 | Shinmori | |
| 5,818,761 A | 10/1998 | Onakado et al. | |
| 5,914,514 A | 6/1999 | Dejenfelt et al. | |
| 5,989,960 A * | 11/1999 | Fukase | 438/267 |
| 6,060,360 A | 5/2000 | Lin et al. | |
| 6,114,724 A * | 9/2000 | Ratnakumar | 257/326 |
| 6,140,688 A * | 10/2000 | Gardner et al. | 257/412 |
| 6,184,093 B1 | 2/2001 | Sung | |
| 6,316,317 B1 | 11/2001 | Kawata et al. | |
| 6,329,247 B1 | 12/2001 | Ito | |
| 6,417,548 B1 | 7/2002 | Sheu et al. | |
| 6,501,147 B1 | 12/2002 | Vajana et al. | |
| 6,579,762 B2 | 6/2003 | Io | |
| 6,828,624 B1 * | 12/2004 | Goda et al. | 257/324 |
| 7,018,898 B2 | 3/2006 | Schuler et al. | |
| 2001/0044183 A1 | 11/2001 | Io | |

FOREIGN PATENT DOCUMENTS

| | | |
|---|---|---|
| JP | 63-117470 A | 5/1988 |
| JP | 03-177065 A | 8/1991 |
| JP | 04-10662 A | 1/1992 |
| JP | 07-202143 A | 8/1995 |
| JP | 08-64703 A | 3/1996 |
| JP | 08-64730 A | 3/1996 |
| JP | 09-036318 | 2/1997 |
| JP | 10-083689 | 3/1998 |
| JP | 10-242414 | 9/1998 |
| JP | 2000-69361 A | 9/2000 |
| JP | 2000-269361 A | 9/2000 |
| JP | 2001-044395 A | 2/2001 |

OTHER PUBLICATIONS

European Search Report for counterpart application No. EP 08 167 292.5, issued Nov. 21, 2008, 5 pages.

Translation of Notice of Reasons for Refusal, issued in counterpart Japanese patent application No. 2003-561001, Dated Oct. 6, 2009, 4 pages.

* cited by examiner

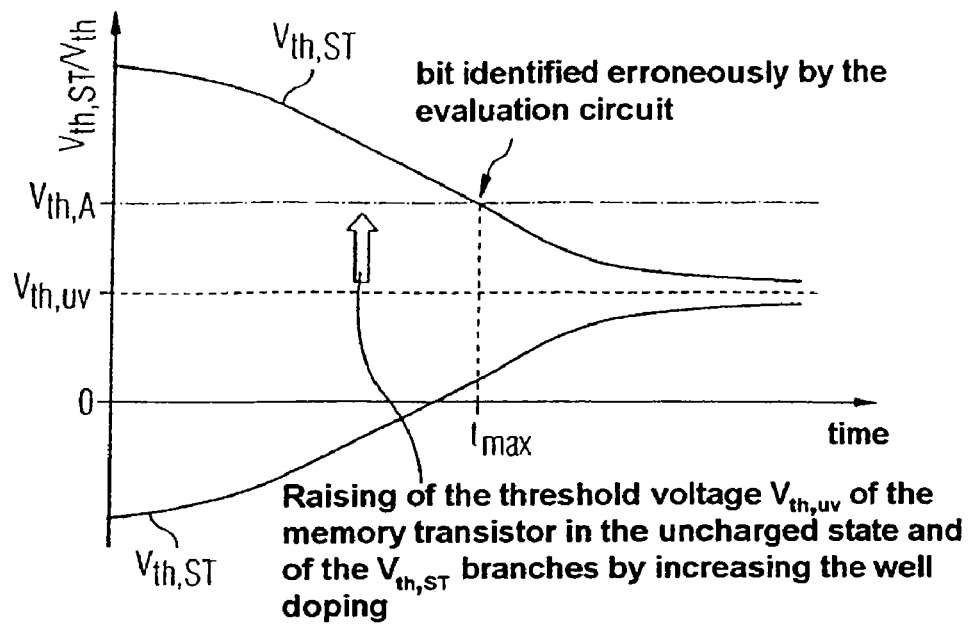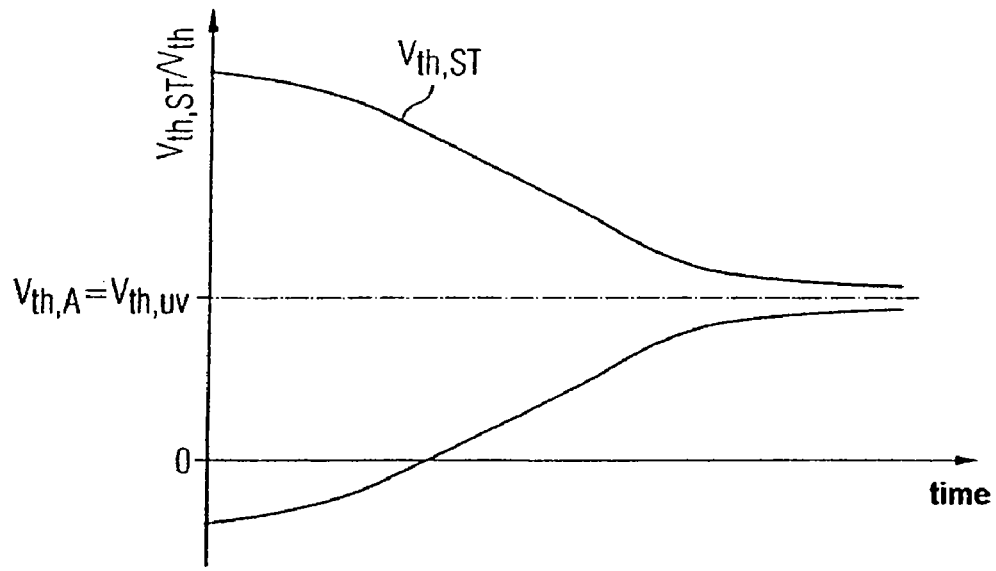

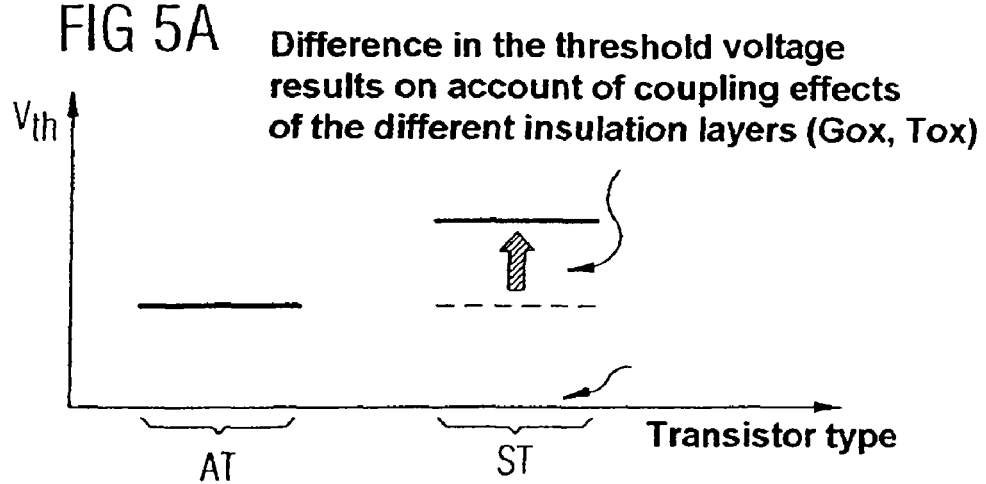
FIG 5A — Difference in the threshold voltage results on account of coupling effects of the different insulation layers (Gox, Tox)
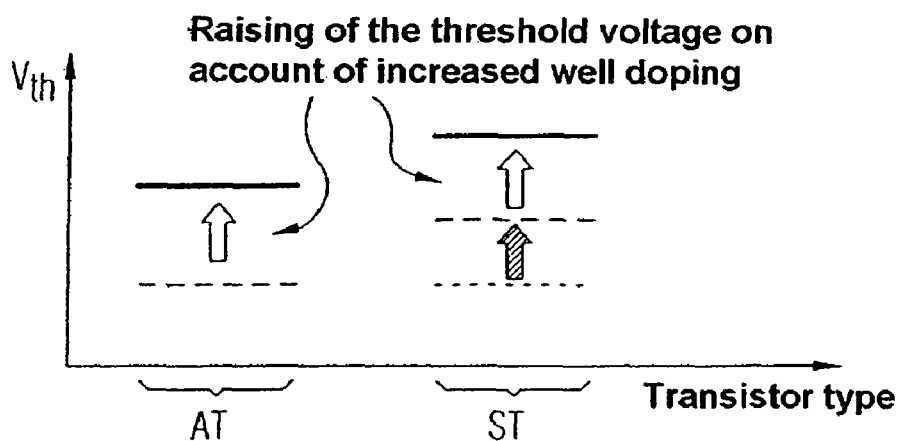
FIG 5B — Raising of the threshold voltage on account of increased well doping
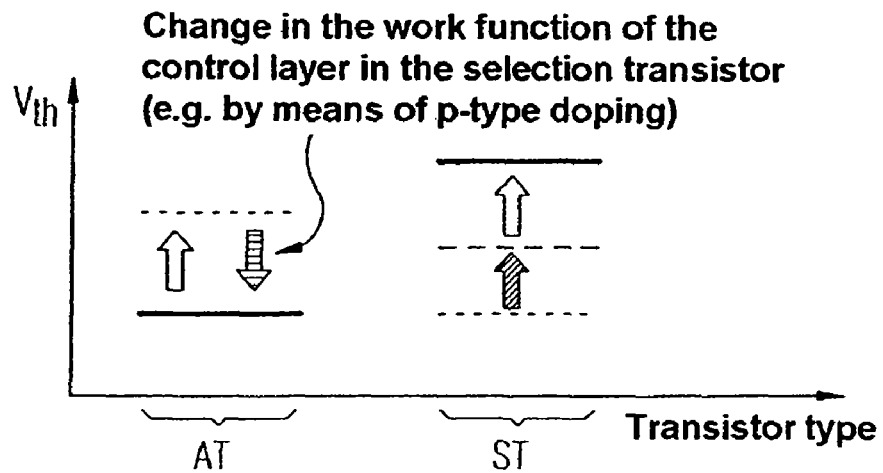
FIG 5C — Change in the work function of the control layer in the selection transistor (e.g. by means of p-type doping)

NON-VOLATILE TWO TRANSISTOR SEMICONDUCTOR MEMORY CELL AND METHOD FOR PRODUCING THE SAME

RELATED APPLICATIONS

This application is a continuation of U.S. patent application Ser. No. 11/331,473, filed on Jan. 13, 2006, which is a divisional of U.S. patent application Ser. No. 10/501,430, which is the National Stage of international patent application number PCT/DE02/04521, filed on Dec. 10, 2002, which was published as international publication number WO03/061 011 A 1, in German, all of which are incorporated herein by reference. This application is further related to and claims the benefit of priority under 35 U.S.C. §§119 to the filing date of Jan. 15, 2002 of German patent application number 102 01 303.9, filed on Jan. 15, 2002, which is incorporated herein by reference.

BACKGROUND

The present invention relates to a nonvolatile two-transistor semiconductor memory cell and an associated method for fabricating it, and in particular to a nonvolatile semiconductor memory cell having a memory transistor and a selection transistor connected thereto.

FIG. 1 shows a simplified sectional view of such a conventional nonvolatile two-transistor semiconductor memory cell, in which case, in a semiconductor substrate 1, which is p⁻-ooped, for example, a selection transistor AT and a memory transistor ST are formed and are connected to one another via a common source/drain region 2.

The memory transistor ST usually comprises an insulating tunnel oxide layer 3, a conductive floating gate layer 4, an insulating dielectric layer 5 and a conductive control gate layer 6. For storing information, charges are introduced from the semiconductor substrate 1 into the floating gate layer 4. Examples of methods for introducing the charges into the floating gate layer 4 are injection of hot charge carriers and Fowler-Nordheim tunneling.

For the selection or driving of the actual memory transistor ST, the two-transistor semiconductor memory cell furthermore has a selection transistor AT which, as field-effect transistor, essentially has a gate oxide layer 3' and a control gate layer 4' lying above the latter. The floating gate layer of the memory transistor and the control gate layer of the selection transistor are usually composed of the same material, such as e.g. polysilicon, which is n-doped, for example.

In the case of such nonvolatile two-transistor semiconductor memory cells, the charge retention properties, in particular, are of greater importance for the use and the reliability. Said charge retention properties are usually limited by (anomalous) loss of charge resulting from leakage phenomena. Said loss of charge takes place for example on account of traps or imperfections within the tunnel oxide 3, a tunneling mechanism being assisted by said imperfections or traps (trap assisted tunneling). In order to avoid such leakage currents or in order to improve the charge retention properties, the layer thicknesses for the tunnel oxide layer 3 and/or the dielectric layer 5 are usually increased, as a result of which, however, the electrical properties of the memory cell deteriorate and it is necessary to raise in particular the operating voltages for reading from, writing to and/or erasing the memory cell.

Therefore, the invention is based on the object of providing a nonvolatile two-transistor semiconductor memory cell and an associated fabrication method which have improved charge retention properties.

In particular by virtue of the different configuration of the charge storage layer in the memory transistor and the selection transistor control layer in the selection transistor for the independent optimization of the associated threshold voltages, it is possible to realize an improvement in the charge retention properties in the memory transistor without impairing the electrical properties of the memory cell.

The selection transistor control layer (4*) and the charge storage layer (4) preferably have a different material or, in particular given the same semiconductor material, a different doping. In this way, a field reduction and thus an improvement in the charge retention can be effected in a targeted manner in the memory transistor, while the selection transistor has an essentially unchanged threshold voltage.

A semiconductor substrate with increased doping is preferably used, the selection transistor control layer and the charge storage layer having a semiconductor material with different doping. As a result, it is possible to reduce the electric fields in the memory transistor and thus a leakage current based on tunneling (caused e.g. by imperfections (traps)), since this tunneling current is exponentially dependent on the electric field. On the other hand, the resultant threshold voltage shift is compensated for by an adaptation of the work functions in the selection transistor control layer by means of an opposite doping, as a result of which the absolute threshold voltage of the selection transistor AT is reduced and the read current through the entire cell is thus increased. This in turn allows simpler evaluation circuits on the chip.

As an alternative to increasing the dopant concentration in the substrate, it is also possible only or additionally to dope the channel region or a surface of the substrate more heavily. Furthermore, as an alternative to the entire doping of the substrate or to the surface doping, it is also possible to use an increased well doping in order to modify the threshold voltage.

With regard to the method, a first insulation layer, an electrically conductive semiconductor layer, a second insulation layer and a further electrically conductive layer are formed, preferably both for the selection transistor and for the memory transistor, and patterned in such a way as to produce the two transistors with source and drain regions lying in between in the semiconductor substrate. In this case, an opposite doping is alternatively or additionally to be used only for the electrically conductive semiconductor layer of the selection transistor, in order to reduce the threshold voltage. In this way, a nonvolatile two-transistor semiconductor memory cell having improved charge retention properties can be fabricated in a particularly cost-effective manner.

The invention is described in more detail below using an exemplary embodiment with reference to the drawing.

BRIEF DESCRIPTION OF THE DRAWINGS

FIGS. 4A and 4B show simplified graphical representations for illustrating a dependence of the threshold voltages on time on account of charge losses; and FIGS. 5A to 5C show simplified graphical representations for illustrating the effects of a change in the work function on the threshold voltages in the selection transistor and memory transistor.

DETAILED DESCRIPTION OF THE PRESENTLY PREFERRED EMBODIMENTS

Figure 1:
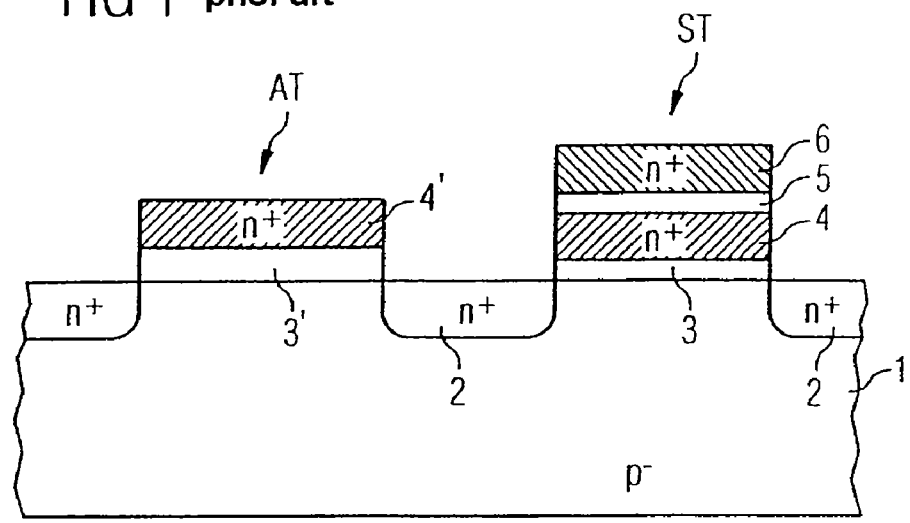
FIG. 1 shows a simplified sectional view of a conventional nonvolatile two-transistor semiconductor memory cell.
Figure 2:
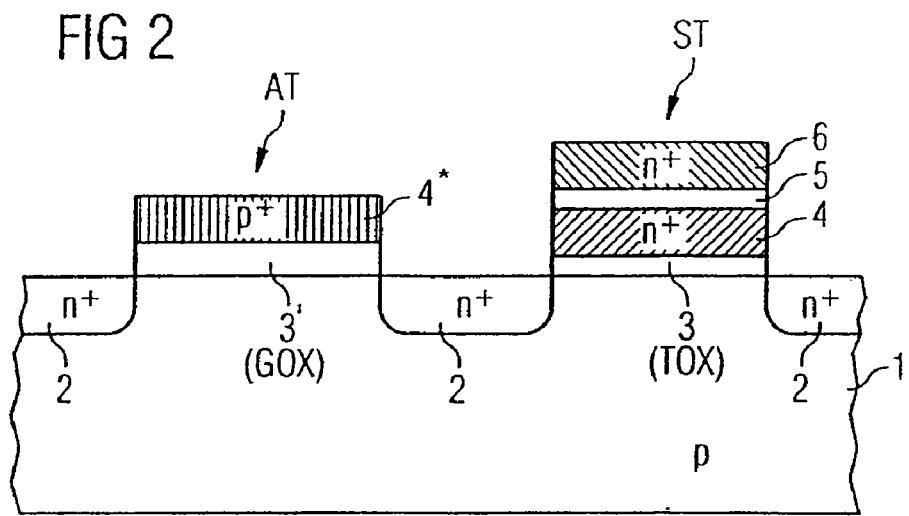
FIG. 2 shows a simplified sectional view of a nonvolatile two-transistor semiconductor memory cell according to the invention.

FIG. 2 shows a simplified sectional view of a nonvolatile two-transistor semiconductor memory cell in accordance with the present invention identical reference symbols designating layers identical or similar to those in FIG. 1.

In accordance with FIG. 2, a selection transistor AT and a memory transistor ST which are connected to one another via a common source/drain region 2 are formed in a substrate 1, which is composed of a p-doped silicon semiconductor material, by way of example. The memory transistor ST has a first memory transistor insulation layer 3, which preferably has a tunnel oxide layer TOX and has a thickness of approximately 10 nm. A charge storage layer 4, which has an n+-doped polysilicon layer, by way of example, is situated at the surface of said first memory transistor insulation layer 3, which comprises a thermally formed $SiO_2$ layer, by way of example. Arranged above said layer 4 is a second memory transistor insulation layer 5, which insulates the charge storage layer 4 from a memory transistor control layer 6 arranged above it. The memory transistor control layer 6 may likewise have n+-doped polysilicon, by way of example, and essentially represents a word line of the memory cell. The second memory transistor insulation layer 5 is also referred to as interpoly dielectric and may have an ONO layer sequence (oxide-nitride-oxide), by way of example.

For its part, the selection transistor AT comprises a first selection transistor insulation layer 3' at the surface of the substrate 1 or channel region lying between the source and drain regions 2, and a selection transistor control layer 4*. The selection transistor insulation layer 3' preferably comprises a gate oxide layer GOX. The selection transistor control layer 4* likewise comprises an electrically conductive layer and, by way of example, a p+-doped polysilicon layer.

The essential difference of the memory cell according to the invention results, then, from the modified doping of the substrate and the resultant modified natural threshold voltages in combination with the choice of different materials or different dopings for the charge storage layer 4 and the selection transistor control layer 4*. An increased threshold voltage of the memory transistor ST is obtained on account of an increased doping of the substrate 1 from p− to p or p+ with dopings remaining the same for the charge storage layer 4 and the memory transistor control layer 6. As is described in detail below, this adaptation of the threshold voltage in the memory transistor ST yields the possibility of optimizing the charge retention properties. On the other hand, in the selection transistor AT, a reduction of the threshold voltage is obtained by means of an opposite doping to the charge storage layer 4. More precisely, the p-type doping of the selection transistor control layer 4* compensates for the increase in the threshold voltage thereof, as a result of which essentially a lowered threshold voltage is produced in the selection transistor and an evaluation circuit (not illustrated) for evaluating the memory cell can thus be realized in simpler fashion.

Accordingly, what is essential to the present concept is that, in the memory transistor ST, the threshold voltage can be optimized with regard to charge retention by way of the substrate, well and/or channel doping and that the resulting disadvantages for the selection transistor can be compensated for by means of an opposite doping to the charge storage layer. As a result, it is possible to reduce the electric fields responsible for tunneling in the memory transistor thereby producing an improved charge retention property, the electrical properties of the cell remaining unchanged with regard to external circuitry since this threshold shift is compensated for again in the selection transistor AT.

Although an identical material (polysilicon) with a different configuration (doping) has been used above, the same effect is also obtained when using different materials (different metals, semiconductors, etc.) for the charge storage layer 4 and the selection transistor control layer 4*.

The relationships described above are explained in detail below, but first a description is given of one possible method for fabricating such a nonvolatile two-transistor semiconductor memory cell.

FIGS. 3A to 3D show simplified sectional views of illustrating essential fabrication steps for the nonvolatile two-transistor semiconductor memory cell according to the invention, identical reference symbols designating identical or similar layers and a repeated description being dispensed with below.

Figure 3A:
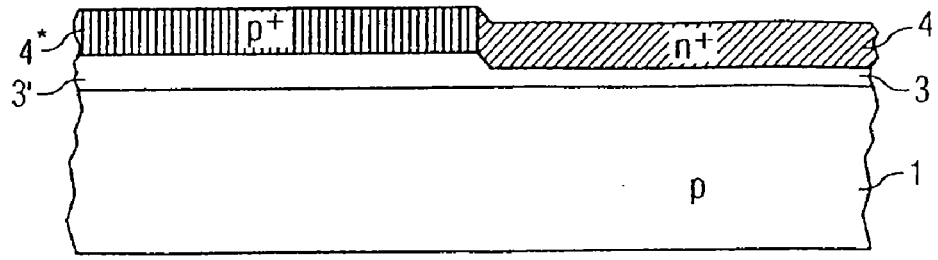
FIGS. 3A to 3D show simplified sectional views for illustrating essential fabrication steps for the nonvolatile two-transistor semiconductor memory cell according to the invention.

In accordance with FIG. 3A, firstly a first insulation layer 3 is formed both in a selection transistor region and in a memory transistor region on a substrate 1, which has, by way of example, a silicon semiconductor substrate with an increased p-type doping. Said first insulation layer 3 or 3' is composed of a thermally formed silicon dioxide, by way of example. A positive effect of a first insulation layer or gate oxide layer 3' of sufficient thickness in the selection transistor region is the avoidance of a dopant, for example boron, penetration into the substrate 1 which can result from a subsequent doping.

An electrically conductive semiconductor layer 4 or 4*(e.g. polysilicon layer) is subsequently formed at the surface, this layer having a doping, such as e.g. an n-type doping, which is opposite to the doping of the substrate 1 for example as a result of a mask in the region of the memory transistor ST. By contrast, by means of a masking, for example, the electrically conductive semiconductor layer 4* can be doped with a doping of the first conduction type, such as e.g. a p-type doping, which is identical to the substrate 1. In this way, the above-described threshold voltages are already set differently in the different regions, a threshold voltage in the selection transistor region preferably being set in such a way that there is no difference from the selection transistor of a conventional nonvolatile two-transistor semiconductor memory cell, as a result of which e.g. already existing evaluation circuits or concepts can be adopted without any difficulty.

As an alternative, however, a superposed doping can also take place, in which case, by way of example, firstly an n-doped electrically conductive layer is deposited both for the selection transistor region and for the memory transistor region (for example in-situ doped) and a counterdoping is subsequently effected for the selection transistor region by means of a masked implantation, by way of example. In principle, the first whole-area doping can also be implemented by a whole-area implantation or some other doping.

The differently doped polylayers 4 and 4* are preferably fabricated by means of conventional phototechnology and implantation, in which case one of these can be effected over the whole area and just the second is masked by means of phototechnology, by way of example. Consequently, an over-compensation of the first doping is effected in the course of this doping. Boron is usually used for the p-type doping of the electrically conductive semiconductor layer 4* in the selection transistor region, while a phosphorous or arsenic doping is usually carried out for the n-type doping in the memory transistor region.

Figure 3B:
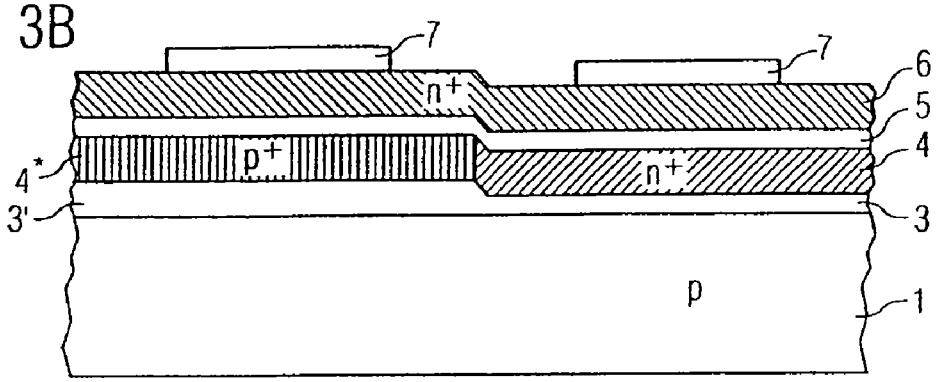

In accordance with FIG. 3B, in a subsequent step, a second insulation layer 5 is formed at the surface of the electrically conductive semiconductor layer 4 or 4*, in which case this must be formed at least in the memory transistor region. This second insulation layer 5 is usually referred to as interpoly dielectric and may have an ONO layer sequence, by way of example, as a result of which particularly good insulation properties in conjunction with good capacitive coupling can be realized and, in particular, leakage currents to a subsequently formed further electrically conductive layer 6 are prevented. The further electrically conductive layer 6 in turn comprises for example an n'<doped polysilicon layer which is deposited or grown by a conventional method.

Finally, a mask layer 7 is formed at the surface of at least the further electrically conductive layer 6 in the memory transistor region ST and the electrically conductive semiconductor layer in the selection transistor region AT and patterned, it being possible to use a conventional hard mask layer, by way of example.

Figure 3C:
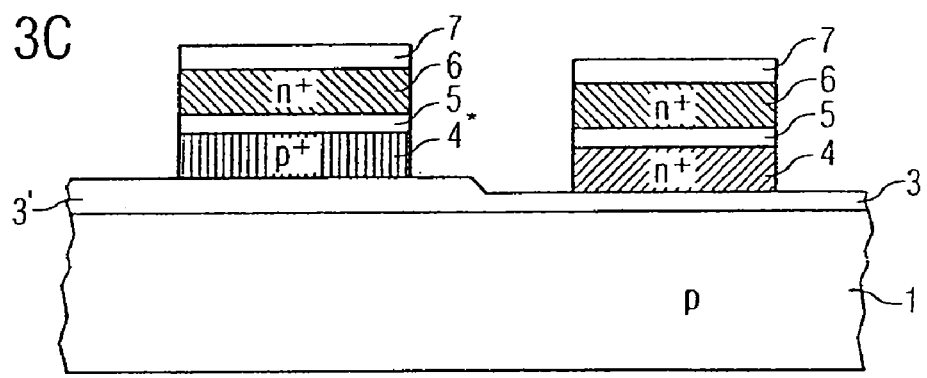

In accordance with FIG. 3C, firstly the further electrically conductive layer 6 is then partly removed using the patterned mask layer 7, as a result of which firstly the word lines of the memory transistors ST and, moreover, by further removing the layers down to the electrically conductive semiconductor layer 4 or 4* also the lines of the selection gates of the selection transistors are obtained. A respectively available standard etching method can be used for removing these layers 4 or 4*, 5 and 6, anisotropic etching methods being appropriate, in particular, which act selectively with respect to the first insulation layer 3, 3' and with respect to the mask layer 7.

Figure 3D:
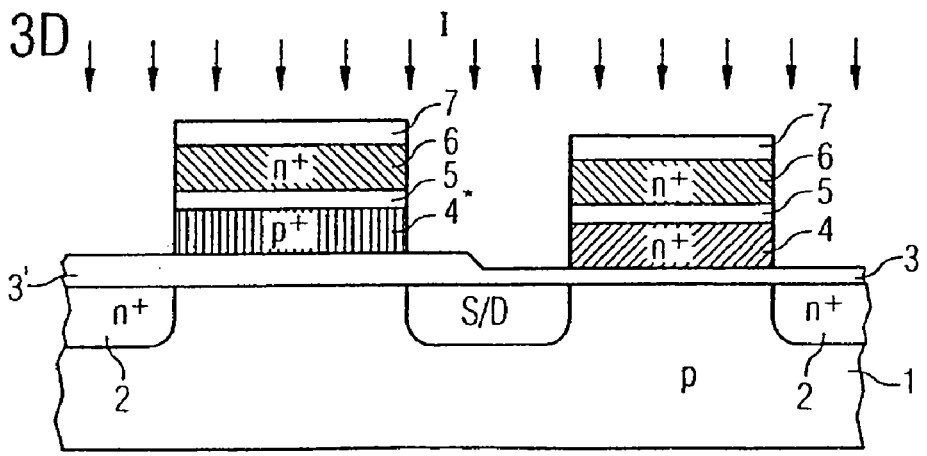

In accordance with FIG. 3D, in a final fabrication step, a self-aligning implantation I is carried out in order to realize the source/drain regions 2, an n-type doping by means of phosphorous or arsenic, for example, being effected in order to fabricate an NMOS transistor. Further fabrication steps for completing the two-transistor semiconductor memory cell are not described below since they are generally known.

In this case, the layers 5, 6 and 7 that are not required for the selection transistor AT remain unconnected or can be removed in a subsequent method step. In this way, a nonvolatile two-transistor semiconductor memory cell with improved charge retention properties is obtained which can be fabricated in a particularly simple manner.

In order to illustrate the method of operation of the memory cell according to the invention, the influences of a threshold voltage in the memory transistor on the charge retention properties are described with reference to FIGS. 4A and 4B.

FIG. 4A shows a graphical representation of the critical threshold voltages in a memory cell and their time dependence if the memory cell exhibits (anomalous) charge loss effects.

In accordance with FIG. 4A, $V_{th,uv}$ represents a threshold voltage of the memory transistor ST in an uncharged state (e.g. after a UV erasure). The branches $V_{th,ST}$ show the threshold voltage of the memory transistor ST in the charged state and the transient profile of the threshold voltage through to the so-called uncharged state, in which there are no charges whatsoever in the charge-storing layer 4. This discharge essentially results from leakage currents brought about by e.g. trap assisted tunneling.

$V_{th,A}$ represents a threshold voltage of an evaluation circuit that is usually required for the memory cell, which may be more or less high or fine. What holds true in principle, however, is that an associated evaluation circuit can be produced particularly simply and cost-effectively the higher said voltage $V_{th,A}$ is. On the other hand, FIG. 4A shows that the higher this threshold voltage $V_{th,A}$ is, the earlier an instant $t_{max}$ is reached at which a stored bit is only identified erroneously by the evaluation circuit.

The present invention now effects a raising of the threshold voltage $V_{th,UV}$ of the memory transistor ST in the uncharged state and of its associated discharge curves $V_{th,ST}$ by means of, for example, the above-described increase in a substrate doping, a channel region doping, and/or a well doping. The ideal curve illustrated in FIG. 4B is obtained as a result of this raising of the threshold voltage $V_{th,UV}$, an improved charge retention property being obtained since the threshold voltage $V_{th,A}$ of the evaluation circuit coincides with the threshold voltage $V_{th,UV}$ of the memory transistor.

FIGS. 5A to 5C show graphical representations for further illustration of the threshold changes according to the invention on account of the changes in the substrate doping or the opposite gate doping of the selection transistor (different configuration of charge storage layer and selection transistor control layer).

FIG. 5A shows a graphical representation of the threshold voltages $V_{th}$ for a selection transistor AT and a memory transistor ST, a difference in the respective threshold voltages already being produced on account of coupling effects of the different insulation layers GOX and TOX and of the layer 5 in the respective regions. As a rule, the memory transistor ST formed in the same substrate 1 has a higher threshold value $V_{th}$ than the associated selection transistor AT.

The effect of increasing the substrate doping is now described in accordance with FIG. 5B, both threshold voltages being raised equally as a result of the increased doping in the substrate 1, as a result of an increased well doping and/or an increased surface doping. In this way, although the improved charge retention properties in the memory transistor ST in FIG. 4B are already obtained, the electrical properties of the memory cell are significantly impaired in particular on account of the increased threshold voltages in the selection transistor.

Accordingly, a correction of the threshold raising in the selection transistor AT is effected in accordance with FIG. 5C, which is essentially effected by increasing the work function for electrons in the control layer by means of an opposite p-type doping, by way of example. This change in the work function only in the selection transistor AT accordingly forces back the threshold voltage $V_{th}$ in this region again, as a result of which a threshold voltage similar to the initial state and, consequently, similarly good electrical properties of the memory cell are obtained. In this way, the charge retention properties in a two-transistor semiconductor memory cell can be significantly improved without influencing the electrical properties or a required evaluation circuit.

The invention has been described above using an NMOS memory cell. However, it is not restricted thereto and encompasses PMOS or a combination of PMOS and NMOS cells or transistors in the same way. In the same way, the invention is not restricted to silicon semiconductor materials, but rather encompasses all further semiconductor materials which can be used to alter a threshold voltage in a targeted manner in order to improve the charge retention properties. In the same way, for the charge storage layer, the memory transistor control layer and the selection transistor control layer, it is possible to use not just a semiconductor material, but rather, in the same way, an alternative material such as e.g. metals.

List of Reference Symbols
1 Substrate
2 Source/drain regions
3, 3' First insulation
4 Charge storage layer
4\* Selection transistor control layer
5 Second insulation layer 6 Memory transistor control
7 Mask layer
AT Selection transistor
ST Memory transistor
$V_{th,A}$ Threshold voltage of the evaluation circuit
$V_{m,uv}$ Threshold voltage of the memory transistor in the uncharged state
Vth,ST Threshold voltage of sthe memory transistor in the charged state

The invention claimed is:

1. Nonvolatile two-transistor semiconductor memory cell comprising:
   a memory transistor having a predetermined threshold voltage, which has a source region and drain region with a channel region lying in between in a substrate, a first memory transistor insulation layer, a charge storage layer, a second memory transistor insulation layer and a memory transistor control layer being formed at the surface of the channel region; and
   a selection transistor having a predetermined threshold voltage, which has a source and drain region with a channel region lying in between in the substrate, a first selection transistor insulation layer and a selection transistor control layer being formed at the surface of the channel region;
   wherein a selection transistor threshold in the selection transistor and a memory transistor threshold in the memory transistor are different due to different insulation layers and are raised by an increased substrate doping and, wherein the selection transistor control layer is formed differently from the charge storage layer for correction of the threshold raising in the selection transistor, the charge storage layer and the selection transistor control layer each having a metallic layer; and
   wherein the metallic layer of the selection transistor control layer is formed from a different material than the metallic layer of the charge storage layer such that a change in the work function in the selection transistor forces back the threshold voltage of the selection transistor to thereby reduce electric fields responsible for tunneling in the memory transistor.

2. Nonvolatile two-transistor semiconductor memory cell according claim 1 wherein the first memory transistor insulation layer and the first selection transistor insulation have an $SiO_2$ layer.

3. Nonvolatile two-transistor semiconductor memory cell according claim 1 wherein the memory transistor and the selection transistor represent an NMOS and/or a PMOS transistor.

4. Nonvolatile two-transistor semiconductor memory cell according claim 1 wherein the memory transistor has a TOX insulation layer and the selection transistor has GOX insulation.

* * * * *